(12) United States Patent
Fries

(10) Patent No.: US 7,572,573 B2
(45) Date of Patent: Aug. 11, 2009

(54) MASKLESS PHOTOLITHOGRAPHY FOR ETCHING AND DEPOSITION

(75) Inventor: David P. Fries, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 11/343,594

(22) Filed: Jan. 30, 2006

(65) Prior Publication Data

US 2006/0121395 A1    Jun. 8, 2006

Related U.S. Application Data

(62) Division of application No. 10/179,565, filed on Jun. 25, 2002, now Pat. No. 6,998,219.

(60) Provisional application No. 60/301,218, filed on Jun. 27, 2001.

(51) Int. Cl.
*C25D 5/02* (2006.01)

(52) U.S. Cl. .................. 430/322; 430/324; 430/311; 206/118; 206/91

(58) Field of Classification Search ................ None
See application file for complete search history.

(56) References Cited

U.S. PATENT DOCUMENTS

| | | | |
|---|---|---|---|
| 3,096,262 A | 7/1963 | Shockley | |
| 3,925,677 A | 12/1975 | Fraser | |
| 4,199,688 A | 4/1980 | Ozasa | |
| 5,079,544 A | 1/1992 | DeMond et al. | |
| 5,405,656 A * | 4/1995 | Ishikawa et al. | 427/500 |
| 5,585,477 A | 12/1996 | Kilpatrick | |
| 5,661,500 A | 8/1997 | Shinoda et al. | |
| 5,691,541 A | 11/1997 | Ceglio et al. | |
| 5,866,913 A | 2/1999 | Robinson | |
| 5,870,176 A | 2/1999 | Sweatt et al. | |
| 5,900,637 A | 5/1999 | Smith | |
| 6,060,224 A | 5/2000 | Sweatt et al. | |
| 6,177,980 B1 | 1/2001 | Johnson | |
| 6,188,519 B1 | 2/2001 | Johnson | |
| 6,238,830 B1 | 5/2001 | Rangarajan et al. | |
| 6,238,852 B1 | 5/2001 | Klosner | |
| 6,249,055 B1 * | 6/2001 | Dubin | 257/758 |
| 6,251,550 B1 | 6/2001 | Ishikawa | |
| 6,379,867 B1 | 4/2002 | Mei et al. | |
| 2002/0024714 A1 | 2/2002 | Sandstrom et al. | |

FOREIGN PATENT DOCUMENTS

| | | |
|---|---|---|
| EP | 0 971 387 | 1/2000 |
| EP | 1 033 741 | 9/2000 |
| JP | 57017132 | 1/1982 |
| JP | 63086432 | 9/1986 |
| JP | 63196038 | 8/1988 |
| JP | 03030415 | 2/1991 |
| JP | 03034312 | 2/1991 |
| JP | 03174716 | 7/1991 |
| JP | 04042533 | 2/1992 |
| JP | 04192422 | 7/1992 |
| JP | 05029205 | 2/1993 |
| JP | 05190517 | 7/1993 |
| JP | 07022303 | 7/1993 |
| JP | 05259045 | 8/1993 |
| JP | 0 045906 | 7/1994 |

(Continued)

OTHER PUBLICATIONS

Singh-Gasson et al., "Maskless Fabrication of Light-Directed Oligonucleotide Microarrays Using a Digital Micromirror Array", Nature Biotechnology, 1999, pp. 974-978, vol. 17.

(Continued)

*Primary Examiner*—John A McPherson
*Assistant Examiner*—Daborah Chacko Davis
(74) *Attorney, Agent, or Firm*—Saliwanchik, Lloyd & Saliwanchik

(57) ABSTRACT

The present invention relates to maskless photolithography using a patterned light generator for creating 2-D and 3-D patterns on objects using etching and deposition techniques. In an embodiment, the patterned light generator uses a micromirror array to direct pattern light on a target object. In an alternate embodiment, the patterned light generator uses a plasma display device to generate and direct patterned light onto a target object. Specifically, the invention provides a maskless photolithography system and method for photo stimulated etching of objects in a liquid solution, patterning glass, and photoselective metal deposition. For photo stimulated etching of objects in a liquid solution, the invention provides a system and method for immersing a substrate in an etchant solution, exposing the immersed substrate to patterned light, and etching the substrate according to the pattern of incident light. For patterning photoreactive glass, the invention provides a system and method for exposing photosensitive or photochromic glass, and washing the target glass with rinse and acid etchant solutions. For photoselective metal deposition, the invention provides a system and method for coating and rinsing a substrate prior to exposure exposing the substrate to a patterned light generator to activate areas corresponding to the incident light pattern, and plating the substrate in the area activated by the light after exposure. By providing a maskless pattern generator, the invention advantageously eliminates the problems associated with using masks for photo stimulated etching, patterning glass, and photoselective metal deposition.

14 Claims, 9 Drawing Sheets

FOREIGN PATENT DOCUMENTS

| | | |
|---|---|---|
| JP | 06216006 | 8/1994 |
| JP | 08045906 | 2/1996 |
| WO | WO-9804950 | 2/1998 |
| WO | WO-9938187 | 7/1999 |

OTHER PUBLICATIONS

Gibbs, "New Chip Off the Old Block", Scientific American, Sep. 1996, online document, 3 pages.

Johnson, "Micromirror Arrays Perform Photolithography Step", EETIMES, 1999, online document, 5 pages.

Mendoza et al., "High-Throughput Microarray-Based Enzyme-Linked Immunosorbent Assay (ELISA)", Biotechniques, 1999, online document, 1 page.

Dobrowolski et al., "DNA Microarray Technology for Neonatal Screening", Acta Paediatr Suppl, 1999, online document, 1 page.

Nuwaysir et al., "Microarrays and Toxicolgoy: the Advent of Toxicogenomics", Mol Carcinog, 1999, online document, 1 page.

Khan et al., "Expression Profiling in Cancer Using cDNA Microarrays", Electrophoresis, 1999, online document, 1 page.

Epstein et al., "Microarray Technology—Enhanced Versatility", Persistent Challenge, 2000, online document, 1 page.

Romero et al., "Reverse-Transcription Poylmerase Chain Reaction Detection of the Enteroviruses", Arch Pathol Lab Med, 1999, online document, 1 page.

Sellwood et al., "The Use of Reverse Transcriptase-Polymerase Chain Reaction to Investigate Environmental Samples for the Presence of Enteroviruses", Commun Dis Public Health, 1998, online document, 1 page.

Kurian et al., "DNA Chip Technology", J Pathol, 1999, online document, 1 page.

Tanaka et al., "High-Precision Binary Optical Element Fabricated by Novel Self-Aligned Process", Japanese Journal of Applied Physics, 1999, pp. 6976-6980, vol. 38, No. 12B.

Topper et al., "Low Cost Electroless Copper Metallization of BCB for High-Densisty Wiring Systems", Proceedings International Symposium on Advanced Packaging Materials, 1999, pp. 202-208.

Lin et al., "An Improved Heterojunction-Emitter Bipolar Transistor Using Delta-Doped and Spacer Layers", Materials Chemistry and Physics, 1999, pp. 91-95, vol. 59, No. 1.

Genolet et al., "Soft, Entirely Photoplastic Probes for Scanning Force Microscopy", Review of Scientific Instruments, 1999, pp. 2398-2401, vol. 70, No. 5.

Sthel et al., "Testing a Furfuryl Alchohol Resin as a Negative Photoresist", Polymer Testing, 1999, pp. 47-50, vol. 18, No. 1.

Karafyllidis et al., "Modelling and Simulation", Microelectronic Engineering, 1999, pp. 71-84, vol. 45, No. 1.

Sekiguchi et al., "Influence of Underlayer Reflection on Optical Proximity Effects In Sub-Quarter Micron Lithography", Proceedings of the SPIE- The International Society for Optical Engineering, 1998, pp. 347-355 vol. 3334.

Maeda et al., "ArF Chemically Amplified Negative Resist Using Alicyclic Epoxy Polymer", Journal of Photopolymer Science and Technology, 1998, pp. 507-512, vol. 11, No. 3.

Kudo et al., "Optimization of DUV Negative Resists for 0.15 mu m Lithography", Journal of Photopolymer Science and Technology, 1998, pp. 445-454 vol. 11, No. 1.

Wallraff et al., "Etch Selectivity of 4SiMA:hydroxystyrene based copolymers. Silicon Chemistry for Bilayer Resist Systems", Journal of Photopolymer Science and Technology, 1998, pp. 673-679, vol. 11, No. 4.

Dabbagh et al., "Capabilities and Limitations of Plasma Polymerized Methylsilane (PPMS) All-Dry Lithography", Journal of Photopolymer Science and Technology, 1998, pp. 651-661, vol. 11, No. 4.

Karafyllidis et al., "Negative Resist Profiles in 248-nm Photolithography: Experiment, Modelling and Simulation", Semiconductor Science and Technology, 1998, pp. 603-610, vol. 13, No. 6.

Robertson et al., "New Patternable Dielectric and Optical Materials for MCM-L/D- and o/e MCM-Packaging", Proceedings. The First IEEE International Symposium on Polymeric Electronics Packaging, 1997, pp. 203-212.

Hauouel et al., "Dependence of Developed Negative Resist Profiles on Exposure Energy Dose: Experiment, Modeling, and Simulation", Microelectronic Engineering, 1998, pp. 351-354, vol. 41-42.

Suzuki et al., "Proposal of Coplanar-type High-T/sub c/ Superconducting Field-effect Devices", Physica C, 1997, pp. 2495-2496, vol. 282-287.

Inanami et al., "50 nm Pattern Etching of Si Wafer By Synchrotron Radiation Excited CF/sub 4/plasma", Japanese Journal of Applied Physics, 1997, pp. 7706-7709, vol. 36, No. 12B.

Yasuzato et al., "Optical Proximity Correction of Alternating Phase-Shift Masks for 0.18 mu m KrF Lithography", Proceedings of the SPIE, 1997, pp. 751-762, vol. 3051.

Op De Beeck et al., "NA/sigma Optimization Strategies for an Advanced DUV Stepper Applied to 0.25 mu m and sub-0.25 mu m Critical Levels", 1997, pp. 320-332, vol. 3051.

Hulsmann et al., "Edge-Phase-Shifting Lithography for sub 0.3 mu m T-Gates" Proceedings of the SPIE, 1997, pp. 295-303, vol. 3051.

Jungchul et al., "Measuring Flare and its Effect on Process Latitude", Proceedings of the SPIE, 1997, pp. 708-713, vol. 3051.

Guerin et al., "Simple and Low Cost Fabrication of Embedded Micro-Channels by Using a New Thick-Film Photoplastic", Tranducers 97, 1997, pp. 1419-1422, vol. 2.

La Fontaine et al., "Characterization of SAL605 Negative Resist at Lambada =13 nm", OSA Trends ion Optics and Photonics, 1996, pp. 39-41, vol. 4.

Cha-Won Koh et al., "Characterization of the Resist Pattern Collapse in a Chemically Amplified Resist", Proceedings of the Microlithography Seminar INTERFACE '96, 1996, pp. 295-302.

Miller et al., "Getting the Most from I-Line Technology by Optimizing Numerical Aperture and Partial Coherence for Critical Layers", Proceedings of the Microlithography Seminar INTERFACE '96, 1996, pp. 269-278.

Katsumata et al., "Chemically Amplified Resist Process for 0.25 mu m Generation Photomasks", Proceedings of the SPIE, 1996, pp. 83-91, vol. 2884.

Lee-Soon Park et al., "Effect of Membrane Structure on the Performance of Field-Effect Transistor Potassium-Sensitive Sensor", Sensors and Actuators, 1996, pp. 239-243, vol. A57, No. 3.

Katsumata et al., "A Chemically Amplified Resist Process for 0.25 mu m Generation Photomasks", Proceedings of the SPIE, 1996, pp. 96-104, vol. 2793.

Wada et al., "New Concept for Negative Tone Electron Beam Resist", Proceedings of the SPIE, 1996, pp. 70-77, vol. 2793.

Flack et al., "An Investigation of the Properties of Photosensitive Polyimide Films", Proceedings of the SPIE, 1996, pp. 169-185, vol. 2726.

Op De Beeck et al., "Optical Proximity Effects and Correction Strategies for Chemical Amplified DUV Resists", Proceedings of the SPIE, 1996, pp. 622-633, vol. 2726.

Lin et al., "Water Soluble Resist for "Environmentally Friendly" Lithography", Proceedings of the SPIE, 1996, pp. 308-318, vol. 2725.

Nicolau et al., "Application of DNQ-Based Microlithography to Patterning Bioactive Molecules and Cells" Proceedings of the SPIE, 1996, pp. 500-511, vol. 2724.

Gabor et al., "Block and Random Copolymer Resists Designed for 193 nm Lithography and Environmentally Friendly Supercritical CO/sub 2/ Development", Proceedings of the SPIE, 1996, pp. 410-417, vol. 2724.

Huang et al., "A Negative Tone Resist System Using Vinyl Cyclic Acetal Crosslinker", Proceedings of the SPIE, 1996, pp. 315-322, vol. 2724.

Mori et al., "Investigation of Substrate-Effect in Chemically Amplified Resist", Proceedings of the SPIE, 1996, pp. 131-138, vol. 2724.

Vinet et al., "Undercut Elimination in DUV Negative Systems: Application to Lithography and Etching of Metal Levels", Proceedings of the SPIE, 1996, pp. 82-91, vol. 2724.

Kawahito et al., "Micro-Fluxgate Magnetic Sensing Elements Based on Silicon Microtechnology", Proceedings of the SPIE, 1996, pp. 134-137.

Larsen et al., "Design and Fabrication of Compliant Micromechanisms and Structures with Negative Poisson's Ratio", Proceedings IEEE, The Ninth Annual International Workshop on Micro Electro Mechanical Systems, 1996, pp. 365-371.

Yan et al., "DUV Wafer Processes", Proceedings of the SPIE, 1995, pp. 158-166, vol. 2621.

Suzuki et al., "Focused Ion Beam/Optical-Merged Lithographic Technique Using Ladder Silicone Spin-on Glass", Journal of Vacuum Science & Technology B, 1995, pp. 2593-2596, vol. 13, No. 6.

Arai et al., "Application of Chemically Amplified Resists to Photomask Fabrication", Proceedings of the SPIE, 1995, pp. 74-87, vol. 2512.

Farrar et al., "0.35 Microgram DUV Lithography for Poly Gate Layer", Proceedings of the SPIE, 1994, pp. 321-331, vol. 2196.

Pierre et al., "EDMES: and Expert System for Process Optimization in Micro-lithography", Proceedings of the SPIE, 1994, pp. 267-277, vol. 2196.

Op De Beeck et al., "Lithographic Strategies for 0.35 mu m Poly Gates for Random Logic Applications", Proceedings of the SPIE, 1994, pp. 407-421, vol. 2195.

Goethals et al., "Proximity Effects in Dry Developed Lithography for Sub-0.35 mu m Application", Proceedings of the SPIE, 1994, pp. 394-406, vol. 2195.

Nakano et al., "Transparent Photoacid Generator (ALS) for ArF Excimer Laser Lithography and Chemically Amplified Resist", Proceedings of the SPIE, 1994, pp. 194-204, vol. 2195.

Drozdov et al., "Quantum Wires With Controllable Conducting-Channel Width Based on IN/sub 0.53/Ga/sub 0.47/As/InP Heterostructures", Semiconductors, 1994, pp. 183-187, vol. 28, No. 2.

Tomo et al., "Process Issue Improvement of Surface Image Transfer Technique: Depth-of-Focus Characteristics and Their Comparison with Simulation Results", Journal of Vacuum Science & Technology B, 1993, pp. 2725-2732, vol. 11, No. 6.

Ren et al., "Fabrication of Y-Gate, Submicron Gate Length GaAs Metal-Semiconductor Field Effect Transistors", Journal of Vacuum Science & Technology B, 1993, pp. 2603-2606, vol. 11, No. 6.

Martin et al., "Effects of Focused Ion Beam Reticle Repair on Optical Lithography at I-Line and Deep UltraViolet Wavelengths", Journal of Vacuum Science & Technology B, 1993, pp. 427-431.

Leming Shi, "DNA Microarray (Genome Chip)", website-www.GeneChips.com, 2002, 21 pages.

Dietz et al., "The Process of Dry Film Lamination YPCB Manufacture", Printed Circuit Fabrication, 1999, pp. 42-45 vol. 22, No. 9.

Waldner, "Registration Concepts for Today's Multilayers YPCB Manufacture", Proceedings of the EPC, 1998, pp. 1-14.

Hoffman, "Photosensitive Dielectrics for New SBU-Technology YPCB Manufacture", Proceedings of the EPC, 1998, pp. 1-10.

Hertlein, "Performance and Limits of Photolithographic Technology: PCB Manufacturing Technology Following Microelectronics Production Technologies", Proceedings of the EPC, 1998, pp. 1-7.

Blake, "How Will Direct Imaging Affect AOI? YPCB Manufacture", CircuiTree, 1999, pp. 162,4,6 and 8, vol. 12, No. 3.

Gandhi et al., "HDI PCBs. I", Printed Circuit Fabrication, 1999, pp. 30, 32, 34, vol. 22, No. 3.

Copeland, "Impedance Control Accuracy YPCB Measurement", Printed Circuit Fabrication, 1999, pp. 26-28, 30, vol. 22, No. 2.

Weinhold et al., "PWB Laminates for High-Performance Applications", Electronic Packaging and Production, 1998, pp. 77-78, 80-81, vol. 38, No. 10.

Seyfert, "Dimensional Stability Characteristics YPCB Phototools", Printed Circuit Fabrication, 1998, pp. 62-63, vol. 21, No. 7.

Halevi et al., "Cost-Effective LDI YPCB Lithography", Printed Circuit Fabrication, 1998, pp. 30-31, vol. 21, No. 7.

Rittichier et al., "Laser Direct Imaging: A Strategic Inflection Point YPCB Manufacture", 1998, pp. 124, 126, 128, vol. 11, No. 6.

Ben-Ezra, "Meeting the Challenges of Direct Imaging for Cost-Effective Production YPCBs", 1998, pp. 108, 110, 112 vol. 11, No. 6.

Atiya, "An Innovative Laser Direct Imaging System YPCB Inner Layers", Circuitree, 1998, pp. 94, 96, 98, vol. 11, No. 6.

Raine, "Tenting: Cost Effective Fabrication of High-Density PWBs for the Year 200 and Beyond", Circuit World, 1998, pp. 6-10, vol. 24, No. 3.

Knudsen, "Using a New Photoimageable Dielectric for PWB Sequential Build-Up Technology", Proceedings. The First IEEE International Symposium on Polymeric Electronics Packaging, 1997, pp. 33-41.

Heath et al., "Microvias Buildup PWBs: Next Generation Substrates", SMTA National Symposium, 1997, pp. 1-9.

Brandt et al., "Ground and Power Planes for Impedance-Control and EMI Shielding in PCBs Made from Conductive TLPS Pastes", Proceedings of the Technical Conference, 1997, pp. S6/7/1-7.

Harris, "Zero Touch-Up YPCB Photolithography", Proceedings of the Technical Conference, 1997, pp. S5/5/1-5.

McGrath, "Multilayer PCB Manufacture Using a Permanent Photoresist—It Can Be Done", Proceedings of the Technical Conference, 1997, pp. S5/4/1-5.

Murray, "Laser Imaging Onto Dirtect-Write Film YPCB Manufacture", Proceedings of the Technical Conference, 1997, pp. S15/4/1-4.

Morrison, "TEA CO/sub 2/ Laser Micro Via Fabrication in Standard and Emerging PWB Dielectrics", Proceedings of the Technical Conference, 1997, pp. S15/3/1-7.

Siddhaye, "Integration of Environmental Factors in Process Modelling for Printed Circuit Board Manufacturing. II. Fabrication", Proceedings of the 1997 IEEE International Symposium on Electronics and the Environment, 1997, pp. 226-233.

Linn et al., "An Investigation on Artwork Image Mis-Alignment in Printed Circuit Board Manufacturing", $6^{th}$ Industrial Engineering Research Conference Proceedings, 1997, pp. 696-701.

Hu et al., "Cost Analysis for High Density Printed Wiring Board Manufacturing Processes", IPCWorks '96 Proceedings, 1996, pp. 1-5.

Jain et al., "High-Speed, High-Resolution Ylarge-Area PCB Exposure System", Printed Circuit Fabrication, 1997, pp. 34,36, vol. 20, No. 5.

Murray, "Direct Write Film YPCB Phototools", Printed Circuit Fabrication, 1997, pp. 24, 26-28, vol. 20, No. 5.

Brautigam et al., "Ultra-High Intensity Imaging YPCB Technology", Printed Circuit Fabrication, 1997, pp. 20-22vol. 20, No. 5.

Chew et al., "Wastewater Recycling and Copper Recovery at a California PCB Shop", CircuiTree, 1997, pp. 132, 134, 136, 138, vol. 10, No. 5.

Ho, "What's Up With SBU Technology? YPCB Sequential Build-Up", Printed Circuit Fabrication, 1997, pp. 64,66,68, vol. 20, No. 3.

Bergman, "Relieving the Points of Pain YPCB Data Transfer", Printed Circuit Fabrication, 1997, pp. 50, 52, 54, vol. 20, No. 3.

Singer et al., "Conventional Versus Build-Up PWB Fabrication: Cost Implications for Electronic Packaging", Proceedings of the 1996 International Electronics Packaging Conference, 1996, pp. 443-456.

Ben-Ezra et al., "Direct Imaging Comes of Age YPCB Lithography", CircuiTree, 1997, pp. 80, 82, 86, vol. 10, No. 3.

Miller et al., "Zero Wastewater Discharge YPCB Manufacture", Printed Circuit Fabrication, 1996, pp. 32, 34-36, vol. 19, No. 11.

Meiler et al., "New Photodielectric for the Sequential Build-Up (SBU) of High-Density Interconnect (HDI) PWB", Proceedings of the Printed Circuit World Convention VII, 1996, pp. PO08/1-2.

Lutschounig et al., "Buried Jumper Technology YPCBs", Proceedings of the Printed Circuit World Convention VII, 1996, pp. P16/1-11.

Wedeking, "Tooling Data Farm YPCB CAD/CAM", Proceedings of the Printed Circuit World Convention VII, 1996, pp. P4/1-5.

Tanizawa, "IBSS (R) Based PCB Technology for High Pin Count/Fine Pitch Package Assembly", Proceedings of the Printed Circuit World Convention VII, 1996, pp. P21/1-6.

Ohta, "Development of DVH-ADD Printed Wiring Board for High Density MCM", Proceedings of the Printed Circuit World Convention VII, 1996, pp. P21/1-6.

McGregor, "Effects of Copper Foil Type and Surface Preparation on Fine Line Image Transfer in Primary Imaging of Printed Wiring Boards", Proceedings of the Printed Circuit World Convention VII, 1996, pp. 17/1-20.

Vaughan et al., "Advances in Environmentally Conscious Manufacturing Through the Use of Permanent Photoimagable Materials in PWB Fabrication", Proceedings of the Printed Circuit World Convention VII, 1996, pp. S10/3/1-5.

Conrod et al., "PhotoDefinable Dielectric Materials for High Density Printed Wiring Board Applications", Proceedings of the Technical Conference IPC Printed Circuits EXPO, 1996, pp. S8/5/1-6.

Nakahara et al., "Review of the Current Status of Laser Direct Imaging YPCB Manufacture", Proceedings of the Technical Conference IPC Printed Circuits EXPO, 1996, pp. S8/1/1-3.

Aday et al., "A Comparative Analysis of High Density PWB Technologies", Proceedings of the SPIE, 1996, pp. 239-244, vol. 2794.

Holden, "Comparing Costs for Various PWB Build-Up Technologies YMCM-L", 1996, pp. 15-21, vol. 2794.

Eickmans, "Mastertool: A New Dry Phototool in the Production of Printed Circuit Boards", Circuit World, 1996, pp. 26-32, vol. 22, No. 3.

Crum, "Imaging Technology: Today, Tomorrow and Beyond YPCB Manufacture", Electronic Packaging and Production, 1996, vol. 36, No. 3.

Layden, "Is Photoplotting Finally Seeing the Light? II. YPCB Design", Printed Circuit Design, 1995, pp. 27-28, vol. 12, No. 12.

Ohlig, "Lighting Equipment and Fine-Line Production YPCB Lithography", Printed Circuit Fabrication, 1996, pp. 32-33, vol. 19, No. 1.

Frauzem, "Increasing Productivity YPCB Lithography", Printed Circuit Fabrication, 1996, pp. 26-28, vol. 19, No. 1.

Nakamura et al., "High Reliability, High Density Build Up Printed Circuit Board for MCM-L", Proceedings 1995 International Conference on Multichip Modules (SPIE), 1995, pp. 36-41, vol. 2575.

Layden, "Is Photoplotting Finally Seeing the Light? I. YPCB Design", Printed Circuit Design, 1995, pp. 16-17.

Yoshiki et al., "Pattern Formation of Cu Layer By Photocatalytic Reaction of ZnO Thin Film Y Printed Circuit Boards", Journal of the Electrochemical Society, 1995, pp. L235-7, vol. 142, No. 12.

Dietz, "Fine Line Imaging (PCB Photolithography)", Printed Circuit Fabrication, 1995, pp. 32, 34, 36, vol. 18, No. 10.

Bridges, "Fine-Line Imaging. (PCB Manufacture)", Printed Circuit Fabrication, 1995, pp. 34, 36-38, vol. 18, No. 7.

Schillhammer, "Rapid Multi-Layer PCB Prototyping in an Engineering Lab Environment", Proceedings of the Technical Program. National Electronic Packaging and Production Conference, 1994, pp. 49-52.

Soules, "Dissecting Film Defects (PCB Manufacture, Imaging Contamination)", Printed Circuit Fabrication, 1994, pp. 26, 28, vol. 17, No. 12.

Layton, "Gerber Basics: A PCB Primer-What is the Gerber Format, and Why Do I Need It?", Printed Circuit Fabrication, 1994, pp. 30-32, vol. 16, No. 7.

Bowls et al., "Illuminating Imaging (PCB)", Printed Circuit Fabrication, 1993, pp. 40-41, vol. 16, No. 5.

Timmons, "Imaging Large High Performance Printed Wiring Boards", Surface Mount International Conference and Exposition. Proceedings of the Technical Program, 1992, pp. 543-546, vol. 1.

Kimura et al., "Mass-Production of PWBs With 5 Track Technology", NEC Technical Journal, 1993, pp. 77-81, vol. 45, No. 9.

Shawhan et al., "Plated Copper Ceramic PWBs: a Versatile Metallization Technology", Hybrid Circuit Technology, 1992, pp. 28-33, vol. 8, No. 12.

Venkata, "Industrial Fabrication of Printed Circuit Boards", Electrical India, 1990, pp. 13-1, vol. 30, No. 23.

Rust, "Plasma cleaning of lands to improve bonding of surface mount components to printed wiring boards", IEPS, Proceedings of the Technical Conference, 1990, pp. 95-109.

Lozano, "Phototools are Developing the Future of PCBs", Electronic Packaging and Production, 1990, pp. 42-44, vol. 30, No. 12.

No-Author, "The Production of PCBs Using Pre-Sensitized Base Material", Revista Espanola De Electronica, 1990, pp. 36-38, No. 427.

Weinhold, "Solder-Stopping Masks for Printed Circuit Boards", Elektronik Praxis, 1990, pp. 30-33, vol. 25, No. 15.

Berry, A Fabricator's Experience With a Curtain Coatabe PILSM with SMT type PWBs, 1990, pp. 731-738, vol. 1.

Pavese et al., "The Three Dimensions made in Italy (PCBs)" Elettronica Oggi, 1990, pp. 160-172, No. 90.

Mougin et al., "Magnetic Micropatterning of FeNi/FeMn Exchange Bias Bilayers By Ion Irradiation", Journal of Applied Physics, 2001, pp. 6606-6608, vol. 89, No. 11.

Guo et al., "Use of MicroFabricated Cold Field Emitters in Sub-100 nm Maskless Lithography", Journal of Vacuum Science & Technology, 2001, pp. 862-865, vol. 19, No. 3.

Menon et al., "Zone-Plate-Array Lithography (ZPAL): Simulations for System Design", AIP Conference Proceedings, 2000, pp. 647-652, No. 507.

Ishibashi et al., "Combining Atomic Force Microscopic Lithography with Photolithography", Japanese Journal of Applied Physics, 2000, pp. 7060, vol. 39, No. 12B.

Parker et al., "A High Throughput NGL Electron Beam Direct-Write Lithography System", Proceedings of the SPIE, 2000, pp. 713-720, vol. 3997.

Dai et al., "Lossless Layout Compression For Maskless Lithography System", Proceedings of the SPIE, 2000, pp. 467-477, vol. 3997.

Luo xian-Gang, "Nanolithography Technology", Wuli, 2000, pp. 358-363, 350, vol. 29, No. 6.

Parker et al., "A High Throughput Electron-Beam Direct-Write Lithography System", Microlithography World, 2000, pp. 22, 24-25, 30, vol. 9, No. 3.

Lakner et al., "Micromirrors For Direct Writing Systems and Scanners", Proceedings of the SPIE, 1999, pp. 217-227, vol. 3878.

Higgins et al., "Anisotropic Spinodal Dewetting as a Route to Self-Assembly of Patterned Surfaces", Nature, 2000, pp. 476-8, vol. 404, No. 6777.

Polesello et al., "Micromachining of Silicon With a Proton Microbeam", Nuclear Instruments & Methods in Physics Research, 1999, pp. 173-178, vol. 158, No. 1-4.

Carter et al., "Maskless, Parallel Paterning With Zone-Plate Array Lithography", Journal of Vacuum Science & Technology, 1999, pp. 3449-3452, vol. 17, No. 6.

Carter et al., "Zone-Plate Array Lithography (ZPAL): A New Maskless Approach", Proceedings of the SPIE, 1999, pp. 324-332, vol. 3676.

Watjen et al., "On the Interpretation of Micro-PIXE Measurements on a Prototype Microstructured Reference Material", Nuclear Instruments & Methods in Physics Research, 1999, pp. 532-537, vol. 150, No. 1-4.

Pueker et al., "High Resolution Phase Zone Plates for Water Window Wavelengths", Proceedings of the SPIE, 1998, pp. 118-128, vol. 3449.

Groves et al., "Distributed, Multiple Variable Shaped Electron Beam Column for High Throughput Maskless Lithography", Journal of Vacuum Sciences, 1998, pp. 3168-3173, vol. 16, No. 6.

Fuller et al., "Photomask Edge Roughness Characterization Using an Atomic Force Microscope", Proceedings of the SPIE, 1998, pp. 433-440, vol. 3332.

Descour et al., "Mass-Producible Microtags for Security Applications: Calculated Fabrication Tolerances By Rigorous Coupled-Wave Analysis", Optical Engineering, 1998, pp. 1254-1261, vol. 37, No. 4.

Avramescu et al., "Atomic Force Microscope Lithography on Carbonaceous Films Deposited by Electron-Beam Irradiation", Applied Physics Letters, 1998, pp. 716-718, vol. 72, No. 6.

Trau et al., "Microscopic Patterning of Orientated Mesoschopic Silia Through Guided Growth", Nature, 1997, pp. 674-676, vol. 390, No. 6661.

Descour et al., "Mass-Producible Microtags for Security Applications: Tolerance Analysis by Rigorous Coupled-Wave Analysis", Proceedings of the SPIE, 1997, pp. 15-24, vol. 3009.

Graham et al., "Conducting Polyaniline Coatings For Submicron Lithography and SEM Technology", Proceedings of the SPIE, 1997, pp. 105-113, vol. 3048.

Sweatt et al., "Mass-Producible Microtags", OSA Trends in Optics and Photonics, 1996, pp. 212-214, vol. 4.

Matsuo et al., "Investigations on Reaction Mechanisms in a Surface Modification Resist Process Using Chemical Vapor Deposition of Polysiloxane", Journal of Electrochemical Society, 1997, pp. 2903-2909, vol. 144, No. 8.

No-Author, "Atom Optics", Proceedings of the SPIE, 1997, vol. 2995.

Biebuyck et al., "Lithography Beyond Light: Microcontact Printing with Monolayer Resists", IBM Journal of Research and Development, 1997, pp. 159-170, vol. 41, No. 1-2.

Terris et al., "Nanoscale Replication for Scanning Probe Data Storage", Applied Physics Letters, 1996, pp. 4262-4264, vol. 69. No. 27.

Descour et al., "Mass-Producible Microscopic Computer-Generated Hologrrams: Microtags", Optics Letters, 1996, pp. 1951-1953, vol. 21, No. 23.

Ishikawa et al., "Nanometer-Scale Pattern Formation of GaAs by In Situ Electron-Beam Lithography Using Surface Oxide Layer as a Resist Film", Journal of Vacuum Science, 1995, pp. 2777-2780, vol. 13, No. 6.

Dz-Chi et al., "Computer Simulations For Mask Structure Heating in X-Ray Lithography", Computers and Structures, 1996, pp. 825-834, vol. 58, No. 4.

Takechi et al., "Effects of Electron Beam Irradiation on Highly Oriented Poly (di-methyl silane) Film", Journal of Physics D, 1995, pp. 535-538, vol. 28, No. 3.

Ruokamo et al., "H/sub 2/S Response of WO/sub 3/ Thin-Film Sensors Manufactured by Silicon Processing Technology", Sensors and Actuators B (Chemical), 1994, pp. 486-488, vol. B19, No. 1-3.

Trippe et al., "Sychrotron Beamless For X-Ray Lithography", Proceedings fo the SPIE, 1994, pp. 314-319, vol. 2045.

Scheckler et al., "Simulation of AZ-PN100 Resist Pattern Fluctuation in X-Ray Lithography, Including Synchrotron Beam Polarization", Japanese Journal of Applied Physics, 1993, pp. 5951-5959, vol. 32, No. 12B.

Schmidt et al., "Wafer Process-Induced Distortion Study for X-Ray Technology", Journal of Vacuum Science, 1991, pp. 3237-3240, vol. 9, No. 6.

Wilkinson, "Dry Etch Damage and its Effect on Electronic and Optical Nanostructures", Superlattices and Microstructures, 1990, pp. 381-386, vol. 7, No. 4.

Mescheder, "Investigation of Linewidth Uniformity in X-Ray Lithography", 1989, pp. 396-340, vol. 1087.

Shiokawa, "Microfabrication Technologies by Focused Ion Beam", 1989, pp. 274-278, vol. 55, No. 2.

Shimazu et al., "High Speed Electron Beam Lithography", Journal of the Japan Society of Precision Engineering, 1987, pp. 1682-1686, vol. 53, No. 11.

Cullman, "Automatic Alignment System", Vortrage des 50. PTB Seminars Mikrometrologie Seminar, 1983, pp. 287-292.

<http://www.envisiontec.de > www.envisiontec.de (Publication date on website is unknown.).

<http://www.micronic.se> www.micronic.se. Note that their micromirror technology is termed SLM technology (The link to this info is: http://www.micronic.se/site_eng/framesets/frame_products.html <http://www.micronic.se/site_eng/framesets/frame_products.html (Publication date on website in unknown.).

Gimkiewicz, E. et al., "High-aspect micro-wingwheels in photosensitive glass", *Microsystem Technologies*, 1997, pp. 40-45, vol. 4, Springer-Verlag.

Salim, R. et al., "Microgrippers created in microstructurable glass", *Microsystem Technologies*, 1997, pp. 32-34, vol. 4, Springer-Verlag.

Yoshida, T., et al., "Photo-Induced Preferential Anodization for Fabrication of Monocrystalline Micromechanical Structures", *Micro Electro Mechanical Systems '92*, Travemünde (Germany), Feb. 4-7, 1992, pp. 56-61, IEEE.

Youtsey, C. et al., "Highly anisotropic photoenhanced wet etching of *n*-type GaN", *App. Phys. Lett.*, Oct. 13, 1997, pp. 2151-2153, vol. 71, No. 15, American Institute of Physics.

\* cited by examiner

MASKLESS PHOTOLITHOGRAPHY FOR ETCHING AND DEPOSITION

CROSS-REFERENCE TO A RELATED APPLICATION

The present application is a divisional application of U.S. patent application Ser. No. 10/179,565, filed Jun. 25, 2002, now U.S. Pat. No. 6,998,219, which claims the benefit of U.S. Provisional Application No. 60/301,218, filed Jun. 27, 2001, both of which are hereby incorporated by reference herein in their entirety, including any figures, tables, or drawings.

TECHNICAL FIELD

The present invention relates to photolithography systems and methods, specifically, to maskless photolithography devices and methods for creating 2-D and 3-D patterns on objects using etching and deposition techniques.

BACKGROUND ART

Photolithography systems are known in the art that direct light beams onto a photosensitive surface covered by a mask, etching a desired pattern on the substrate corresponding to the void areas of the mask. Maskless photolithography systems are also known in the art as described in Singh-Gasson, Sangeet et al., *Nature Biotechnology* 17, 974-78, 1999. The system described in this article uses an off-axis light source coupled with a digital micromirror array to fabricate DNA chips containing probes for genes or other solid phase combinatorial chemistry to be performed in high-density microarrays.

A number of patents also exist which relate to maskless photolithography systems, including U.S. Pat. Nos. 5,870,176; 6,060,224; 6,177,980; and 6,251,550; all of which are incorporated herein by reference. While maskless photolithography systems disclosed in the art are directed to DNA chip and semiconductor manufacture, these prior art systems and methods notably lack reference to other applications lending themselves to maskless photolithography techniques.

Photo-assisted wet etching of various semiconductor materials has been disclosed [Shockley et al., U.S. Pat. No. 3,096,262; T. Yoshida et al., *Proc IEEE Mems.*, 56-61, 1992; B. Peters et al., *7th Intl. Conf. On Solid State Sensors and Actuators (Transducers '93)*, 254-57, 1993; c. Youtsey et al., *Appl. Phys. Lett.* 71(15), 1997]. In these references, the patterns generated are defined by physical masks placed in the path of light used for photo-activation. While use of wet etching techniques simplifies manufacture of semiconductors by eliminated the requirement of clean rooms required by traditional semiconductor manufacturing techniques, physical masks are still required in the process. While effective, the use of physical masks in the wet etching process has numerous drawbacks, including the cost of fabricating masks, the time required to produce the sets of masks needed to fabricate semiconductors, the diffraction effects resulting from light from a light source being diffracted from opaque portions of the mask, registration errors during mask alignment for multilevel patterns, color centers formed in the mask substrate, defects in the mask, the necessity for periodic cleaning and the deterioration of the mask as a consequence of continuous cleaning. Thus, the drawbacks of using masks are not eliminated in the prior art wet etching techniques.

Patterns and structures are known to be created in photosensitive glass, such as with the use of a direct laser writing process (C. Gimkiewicz et al., *Microsystems Technology* 4, 40-45, 1997). It is also known to use a hard physical blocking mask-to-mask ultraviolet (UV) exposure to glass (R. Salim et al., *Microsystems Technology* 4, 32-34, 1997). However, the laser process requires an expensive laser system and associated electronic controls and can produce objectionable waste material during the laser etching process. On the other hand, the UV system disclosed in *Microsystems Technology* eliminates the need for a laser, but still requires the use of masks. Thus, the disadvantages of using masks are not eliminated.

Further, it is also known to make printed metal patterns by etching away unwanted material from a substrate. However, this process can create hazardous waste material that requires special handling for disposal. In addition, the process is inefficient due to loss through waste and expensive reclamation efforts.

Photo-selective metal deposition was introduced by Western Electric, Incorporated in a factory setting in the 1960's. In the Western Electric technology, a photofilm having a pattern thereon was placed on a drum having a light source in its center. However, the film had to be changed to create different patterns, and thereby, this system suffers from the same drawbacks as other mask-type photolithography systems.

Accordingly, there is a need in the art for a method and system for maskless photolithography to create 2-D and 3-D patterns on objects using etching and deposition techniques. Specifically, the method and system needs to provide a maskless photolithography system for wet etching, creation of designs in photosensitive glass, and metal deposition processes. This system needs to combine ease of use, reconfigurability, and the ability to eliminate the need for the use of physical masks. In summary, the system needs to provide all the advantages of a maskless photolithography system at a reasonable cost, and include capabilities tailored to specific applications.

SUMMARY OF THE INVENTION

In view of the foregoing deficiencies of the prior art, it is an object of the present invention to provide a maskless photolithography system for creating 2-D and 3-D patterns on objects using etching and deposition techniques.

It is another object of the present invention to provide a maskless photolithography system and method for photostimulated etching of objects in a liquid solution.

It is still another object of the present invention to provide a maskless photolithography system and method for patterning photosensitive and photochromic glass.

It is yet another object of the present invention to provide maskless photolithography system and method for photoselective metal deposition.

To achieve these objects, a system and method are provided to create two dimensional and three dimensional structures using a maskless photolithography system that is directly reconfigurable and does not require masks, templates or stencils to create each of the planes or layers on a multi layer two-dimensional or three dimensional structure. In an embodiment, the invention uses a micromirror array comprising up to several million elements to modulate light onto an object that has photoreactive compounds applied to the exposed surface or has photoreactive qualities. The desired pattern is designed and stored using conventional computer aided drawing techniques and is used to control the positioning of the individual mirrors in the micromirror array to reflect the corresponding desired pattern. Light impinging on the array is reflected to or directed away from the object to create light and dark spots on the substrate according to the pattern. The positioning information provided to the micromirror array can be modulated to cause the individual mirrors to change their angular position during exposure to reduce the effects of pixelation and stiction. Alternatively, a plasma cell array may be used to generate and direct patterned light on an object, thereby replacing the micromirror array and separate light source and associated optics.

In the disclosed embodiments, various chemical solution application systems are provided and used in conjunction with light exposure to create the desired objects. In addition, an alignment fixture, movable in three dimensions, for mounting of the object is provided. The alignment fixture allows the affixed substrate to be moved in three dimensions, providing alignment in two, coplanar dimensions and a third dimension perpendicular to the two coplanar dimensions. By providing alignment in the third dimensional direction, the invention advantageously provides the capability to produce three-dimensional structures on the object.

The advantages of the invention are numerous. One significant advantage is the ability to use the invention as a reconfigurable, rapid prototyping tool for creating two dimensional and three dimensional micro and macroscopic objects. Another advantage of the invention is that it provides the ability to reduce prototyping costs and enable devices to be fabricated more quickly with less risk. Still another advantage of the current invention is a reduction in cost for prototyping activities realized by the elimination of physical masks. Yet another advantage of the current invention is that pattern generation can be performed optically without having to use an expensive vacuum system required by conventional mask-based photolithography. A particular advantage of the current invention is the ability to use photo-electrochemical induced etching of objects in solution to permit rapid fabrication of patterned objects. Still another advantage of the current invention is the ability to create three-dimensional devices using an alignment stage to selectively expose successive layers in a substrate.

All patents, patent applications, provisional applications, and publications referred to or cited herein, or from which a claim for benefit of priority has been made, are incorporated herein by reference in their entirety to the extent they are not inconsistent with the explicit teachings of this specification.

Other aspects and advantages of the invention will become apparent from the following detailed description taken in conjunction with the accompanying drawings, illustrating, by way of example, the principles of the invention.

BRIEF DESCRIPTION OF THE DRAWINGS

In order that the manner in which the above recited and other advantages and objects of the invention are obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

Figure 1A:
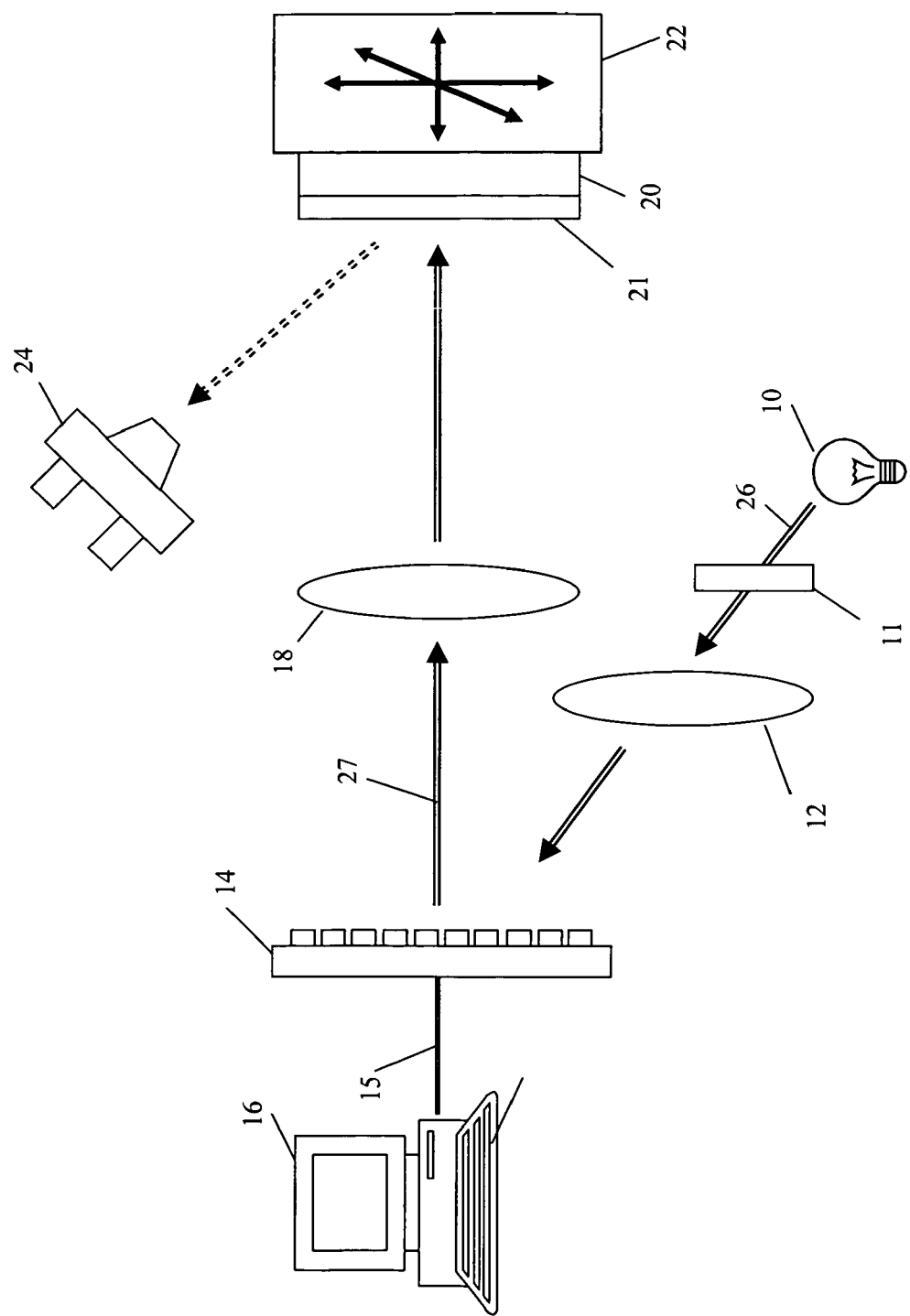
FIG. 1A illustrates a maskless photolithography system.

It should be understood that in certain situations for reasons of computational efficiency or ease of maintenance, the ordering and relationships of the blocks of the illustrated flow charts could be rearranged or re-associated by one skilled in the art. While the present invention will be described with reference to the details of the embodiments of the invention shown in the drawings, these details are not intended to limit the scope of the invention.

DETAILED DISCLOSURE OF THE INVENTION

Reference will now be made in detail to the embodiments consistent with the invention, examples of which are illustrated in the accompanying drawings. First, briefly, the invention is a system and method to create two dimensional and three dimensional structures using a maskless photolithography system that is directly reconfigurable and does not require masks, templates or stencils to create each of the planes or layers on a multi layer two-dimensional or three-dimensional structure. Specifically, the invention provides a system and method for photo-stimulated etching of objects in a liquid solution, patterning photosensitive and photochromic glass, and photoselective metal deposition.

The invention uses a patterned light generator to create a patterned light beam corresponding to a desired mask pattern. Specifically, the invention uses a micromirror array comprising up to several million elements to modulate light onto a substrate that has photoreactive or photoresist compounds applied to the exposed surface. The desired pattern is designed and stored using conventional computer aided drawing techniques and is used to control the positioning of the individual mirrors in the micromirror array to reflect the corresponding desired pattern. Light impinging on the array is reflected to or directed away from the substrate to create light and dark spots on the substrate according to the desired pattern. In addition, an alignment fixture for mounting of the substrate allows the substrate to be moved in three dimensions, providing alignment in two, coplanar dimensions and the capability to produce three dimensional structures by aligning the substrate in a third dimension perpendicular to the two coplanar dimensions.

I. Maskless Photolithography

Referring now to FIG. 1, a maskless lithography system includes a light source 10, a removable filter 11, a first lens system 12, a micromirror array 14, a computer system 16, a second lens system 18, a substrate 20, mounted on a movable alignment fixture 22, and an optical viewer 24. A layer of photoreactive chemicals 21 is disposed on a substrate 20.

As shown, light source 10 provides a beam of collimated light, or light beam 26, which can be selectively filtered by inserting or removing filter 11 from light beam 26. Alternatively, filter 11 can be placed in a patterned light beam 27 reflected from said micromirror array 14. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light in the patterned light beam 27 according to a desired mask pattern stored in memory. In addition, computer system 16 can shift the desired mask pattern in two dimensions to align the pattern with the substrate 20 mounted on movable alignment fixture 22. Precise pattern alignments are made electronically by shifting the mask pattern information provided to the micromirror array such that the image reflected on the substrate is translated to correct for misalignment. For example, if the mask pattern needs to be shifted to the right one pixel width to be properly aligned on the substrate, the computer compensates for the misalignment by shifting the mask pattern one pixel width to the right.

Micromirror array 14 is controlled to modulate the positioning of the mirror to prevent stiction and pixelation. The individual mirrors of micromirror array 14 are driven to vary their angular orientation with respect to on-axis illumination during exposure of a substrate. After being reflected in a desired pattern from micromirror array 14, patterned light beam 27 passes through second lens system 18, and impinges on a layer of photoreactive chemicals 21 applied to substrate 20, thereby creating a pattern on substrate 20 by producing a reaction between the layer of photoreactive chemicals 21 and substrate 20. Alternatively, a photoresist chemical could be applied to substrate 20 to etch areas of substrate 20 not masked off by the mask pattern during an exposure.

The mask pattern described above is a programmable mask pattern generated with the use of computer aided design and is resident on computer system 16. Accordingly, the mask pattern to be transferred to the layer of photoreactive chemicals 21 and substrate 20 is a selectively programmable mask pattern. Thus, with a programmable mask pattern, any portion of the pattern on the substrate 20 can be manipulated and/or changed as desired for rendering of desired changes as may be needed, furthermore, on a significantly reduced cycle time.

Micromirror array 14 described above is a micro mirror device known in the art. With the micro mirror device, light is reflected according to a pattern of pixels as controlled according to a prescribed pixel/bit mask pattern received from computer system 16. The light reflecting from the micro mirror device thus contains the desired mask pattern information. A micro mirror device may include any suitable light valve, for example, such as that used in projection television systems and which are commercially available. Light valves are also referred to as deformable mirror devices or digital mirror devices (DMD). One example of a DMD is illustrated in U.S. Pat. No. 5,079,544 and patents referenced therein, in which the light valve consists of an array of tiny movable mirror-like pixels for deflecting a beam of light either to a display screen (ON) or away from the display optics (OFF). The pixels of the light valve device are also capable of being switched very rapidly. Thus, with the use of the light valve, the photolithography system of the present disclosure can implement changes in the mask pattern in a relatively quick manner. The light valve is used to modulate light in accordance with a mask pattern information provided by the computer system 16. In addition, the DMD reflects light, thus no appreciable loss in intensity occurs when the patterned light is projected upon the desired subject during the lithographic mask exposure.

The positioning of the individual micromirrors in the micromirror array can be modulated slightly while positioned in a desired mask pattern. By slightly changing the position of the mirrors and duration of exposure of a substrate, the effects of pixelation on the exposed substrate and stiction of the mirrors can be reduced. The duty cycle of the modulation command can be selectively modified to achieve an optimum ratio between on axis, direct exposure, and off axis, indirect exposure. As a result, the micromirrors are constantly moving to prevent stiction, and further allow integration of inter-pixel exposure areas to provide uniform coverage of the mask pattern to eliminate pixelation.

Advantageously, images are optionally shifted electronically to provide fine alignment of the pattern on substrate 20. The mask pattern is digitally shifted according to alignment information in one or more directions for achieving a desired mask alignment on substrate 20. Adjustments in alignment are carried out electronically in the mask bit pattern information provided to the light valve. As a result, fine adjustments in pattern alignment can be easily accomplished.

Movable alignment fixture 22, in conjunction with optical viewer 24, provides the capability to initially align substrate 20 under patterned light beam 27 using mechanical alignment mechanisms (not shown) to align substrate 20 in three dimensions. The mechanical alignment system may include gears, pulleys, belts, chains, rods, screws, hydraulics, pneumatics, piezo motion, or combinations thereof as known in the art to support and move an object in three dimensions. While performing alignment procedures, filter 11 is inserted in light beam 26 to filter out the wavelengths of light that react with the layer of photoreactive chemicals 21 on substrate 20. Optical viewer 24, provides a means to monitor the positioning of substrate during manual alignment. While providing alignment in coplanar first and second dimensions, alignment fixture 22 advantageously provides alignment in a direction perpendicular to the coplanar first and second dimensions, allowing fabrication of three dimensional objects. For example, to gain more control over sidewall profiles or to produce complicated structures, multiple layers of substrate 20 can be sequentially exposed by aligning substrate 20 in the third dimension to create three dimensional features. Coupled with optional computer controlled alignment of the desired pattern, the invention provides the capability to quickly manually align substrate 20 under patterned light beam 27 and allows computer system 16 to automatically finely tune the alignment before exposing layer of photoreactive chemicals 21 on substrate 20.

Figure 1B:
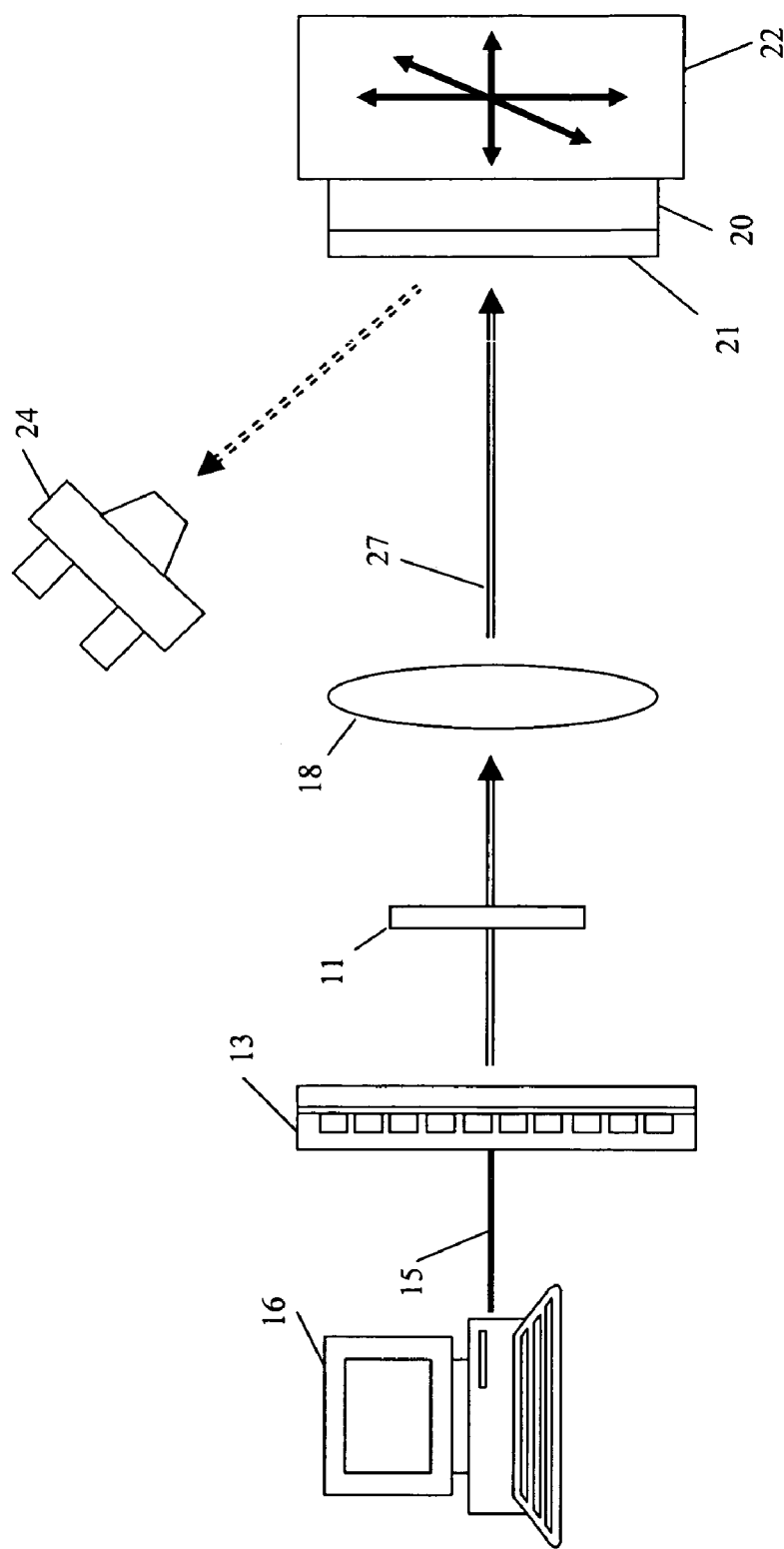
FIG. 1B illustrates a maskless photolithography system using a plasma display.
Figure 2:
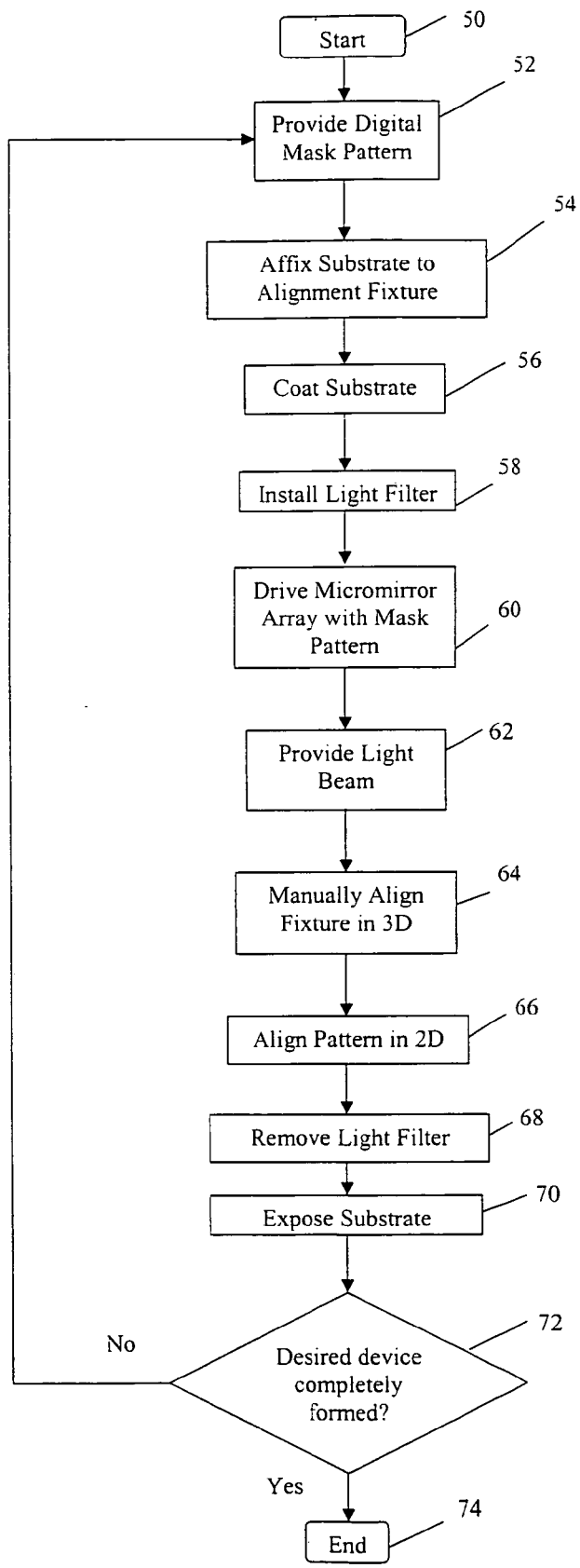
FIG. 2 is a flow chart illustrating a maskless photolithography method.

In an alternative embodiment shown in FIG. 1B, a plasma display device 13 can be substitute for the micromirror array 14, light source 10 and associated optics of FIG. 1A. Referring now to FIG. 1B, an embodiment of the current invention includes a plasma display device 13, a computer system 12, a lens system 16, a substrate 20, mounted on a movable alignment fixture 22, and an optical viewer 24. A layer of photoreactive chemicals 21 is disposed on the substrate 20.

As shown, plasma display device 13 generates a beam of light, or patterned light beam 27, wherein each pixel of the plasma display 13 corresponds to a pixel of the mask pattern. Plasma display device 13 is controlled by computer system 16 over signal line(s) 14 to generate light according to a desired mask pattern stored in memory. In addition, computer system 12 can optionally shift the desired mask pattern in two dimensions to align the pattern with the substrate 20 mounted on movable alignment fixture 22. Precise pattern alignments are made electronically by shifting the mask pattern information provided to the plasma display device 13 such that the image directed to the substrate is translated to correct for misalignment. For example, if the mask pattern needs to be shifted to the right one pixel width to be properly aligned on the substrate, the computer compensates for the misalignment by shifting the mask pattern one pixel width to the right.

The patterned light beam radiated from plasma display device 13 can be selectively filtered by inserting or removing filter 18 from patterned light beam 27. Filtering can take place at any point along the light beam path to prevent exposure during alignment. A lens system 16 can collimate and condition the light beam as desired. After passing through lens system 16, patterned light beam 27 impinges on a layer of photoreactive chemicals 21 applied to substrate 20, thereby creating a pattern on substrate 20 by producing a reaction between the layer of photoreactive chemicals 21 and substrate 20. Alternatively, a photoresist chemical could be applied to substrate 20 to etch areas of substrate 20 not masked off by the mask pattern during an exposure.

A method of using the maskless photolithography system current invention described above will now be explained. It should be understood that in certain situations for reasons of computational efficiency or ease of maintenance, the ordering and relationships of the blocks of the illustrated flow charts could be rearranged or re-associated by one skilled in the art. Starting from step 50, a desired mask pattern is designed and stored on computer system 16 in step 52. Alternatively, mask pattern designs can be designed on other computer systems and imported into computer system 16. Next, in step 54, a substrate 20 is placed on alignment fixture 22 and coated with a layer of photoreactive chemicals 21 in step 56.

Once the substrate is mounted in alignment fixture 22, the filter 11 is placed in the light beam 26 path according to step 58 to filter the light and prevent exposure of the substrate. Next, the computer system 16 can then be instructed to provide the resident mask pattern information to micromirror array 14 as shown in step 60, and the micromirror array 14 responds by orienting each individual mirror to reflect or direct light beam 26 away from substrate 20 according to the desired pattern. Next, alignment of the substrate is enabled by exciting the light source 10 to provide a light beam in step 62, projecting light beam 26 through first lens system 12, and then onto micromirror array 14. In turn, micromirror array 14 reflects light beam 26 through second lens system 18 and onto a layer of photoreactive chemicals 21 and substrate 20.

With the desired pattern projected on substrate 20, alignment fixture 22 can be manually aligned in three dimensions according to step 64 by moving alignment fixture 22 to ensure that substrate 20 is properly located in patterned light beam 27. Proper alignment is verified by viewing the projected pattern on substrate 20 through optical viewer 24. Once substrate 20 is manually aligned, alignment information can optionally be provided to computer system 16 and computer system 16 automatically adjusts the micromirror 14 by shifting the pattern in two dimensions to attain proper alignment in optional step 66. Having aligned substrate 20, the layer of photoreactive chemicals 21 on substrate 20 is exposed in step 70 by removing filter 11 from light beam 26 in step 68 and allowing the light to cause a reaction between layer of photoreactive chemicals 21 and substrate 20 for a required reaction time depending on the photoreactive chemicals used. For example, using standard Novolac™ positive photoresist, an exposure time of 60 seconds is used. In an embodiment, during exposure step 70, the angular position of the mirrors in micromirror array 14 is varied slightly according to commands from computer system 16. For example, when masking a 25 micron square feature, the angular position of the mirrors in micromirror array 14 might be varied so that the mask effectively covers an area of 36 microns square, centered on the desired 25 micron square feature. As a further example, the duty cycle for the angular deflection could be adjusted so that the 25 micron square feature is masked 90% of the total exposure time and the remaining 11 square micron area is covered 10% of the total exposure time. By modulating the position of the mirrors as described, stiction of the mirrors is reduced. Further, pixelation effects on the substrate are reduced by providing mask pattern coverage of the interpixel areas not covered by direct, on axis illumination.

If further exposures are desired in step 72, such as required when creating three-dimensional objects, the above method is repeated by returning to step 52 until the desired object is fabricated. A new digital mask pattern is provided, another photoreactive coat is applied, and the substrate is realigned and re-exposed. Once the desired object has been created, the process ends in step 74.

An example of the current invention using the system and method described above will now be presented. A maskless photography system is especially adapted to be an integrated, reconfigurable, rapid prototyping is described. The system provides optics, a light source, and integrated electronic components used to directly generate patterns for the exposure of photoresist and other photoimagable materials. A broad band spectrum, high intensity white light source provides the exposure energy for the process. This light is then filtered and optimized for the exposure process, using a variety of integrated optical components. A direct coupled optical delivery system ensures efficient transfer of the light energy. Using proven optical techniques, the projected image is free of distortion and uniform through out the exposure area. With the optimized optical stream, the image is imposed in the light path, providing the final exposure pattern. This pattern is then transferred to the substrate surface and used to expose the photo-sensitive material required in the user's fabrication process.

A personal computer operably connected to a micromirror array to provide mask patterns. The mask patterns are generated in the computer and then transferred to the micromirror array to provide the optical pattern for exposure. The pattern is transferred to a substrate and is observed using an optical microscope. This microscope is needed for pattern alignment to the substrate. Alignment is controlled through the use of a course alignment stage provided by a mechanically movable substrate mounting alignment fixture, combined with a fine, electronic alignment stage. This fine alignment stage is computer controlled and aligns the mask pattern reflected from the micromirror instead of moving the alignment fixture, thereby offering exceptional accuracy and repeatability. Once alignment is complete, substrate exposure occurs. Through the use of a step and repeat method, the entire substrate surface can be exposed and multiple layers can be created using an alignment stage movable in a direction parallel to the light beam.

In addition, according the invention, three-dimensional patterns can be created using the three dimension alignment capabilities disclosed above. For example, patterning using thick photo resist or multilayer patterning of individual photoresist layers. These techniques can be use to provide either a photomask for subsequent etching of substrate materials or if the photopolymer is compatible with the chemistry used in the device, the fabricated features can be used as part of the device itself.

The system described above can be adapted for use in novel environments. Specifically, a system and method of maskless photolithography can be used to create 2-D and 3-D patterns on objects using etching and deposition techniques. In particular, systems and methods for photo stimulated etching of objects in a liquid solution, patterning photosensitive and photochromic glass, and photoselective metal deposition will be described below.

II. Maskless Photolithography Photo Stimulated Etching of Objects in a Liquid Solution.

Figure 3A:
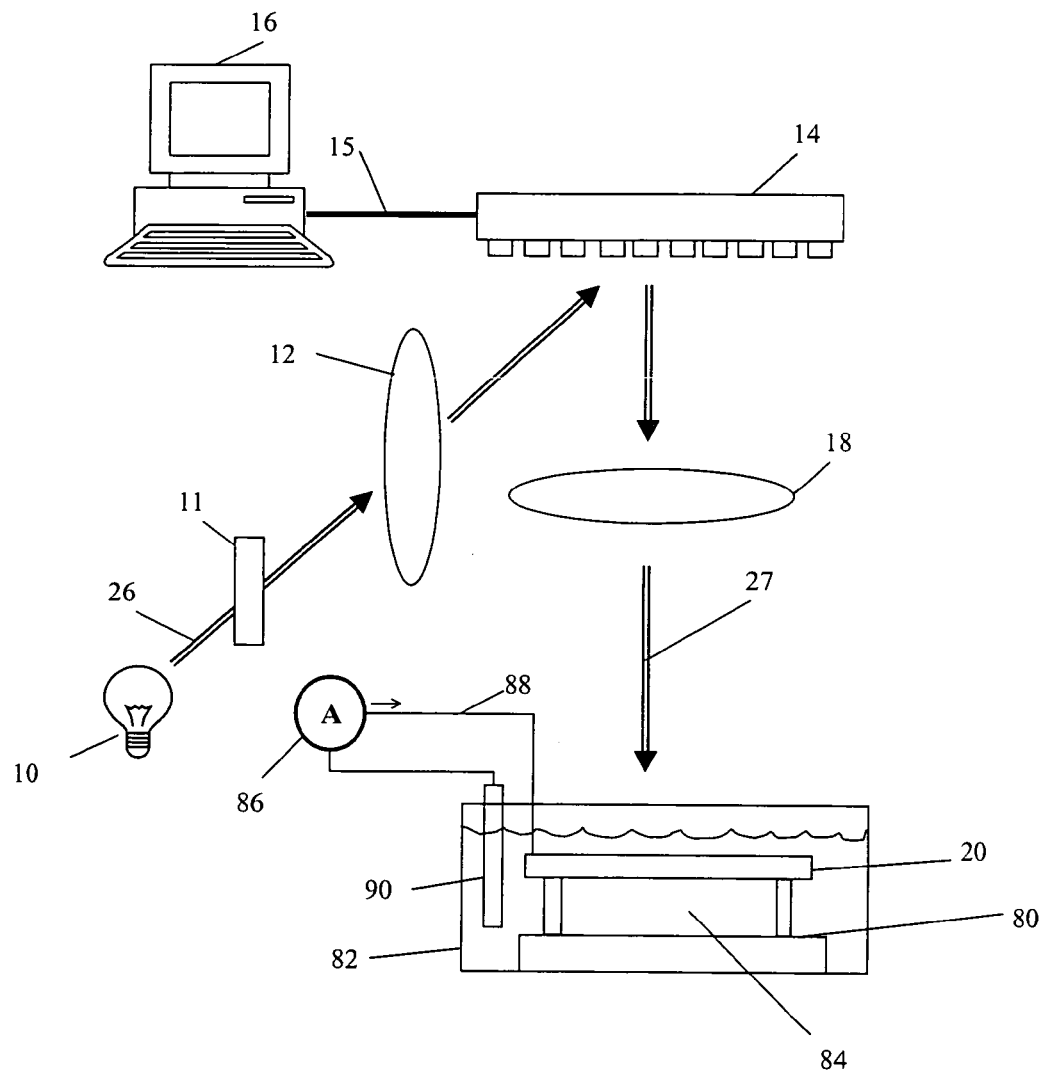
FIG. 3A illustrates a maskless photolithography system for photo stimulated etching of objects in a liquid solution according to an embodiment of the present invention.
Figure 3B:
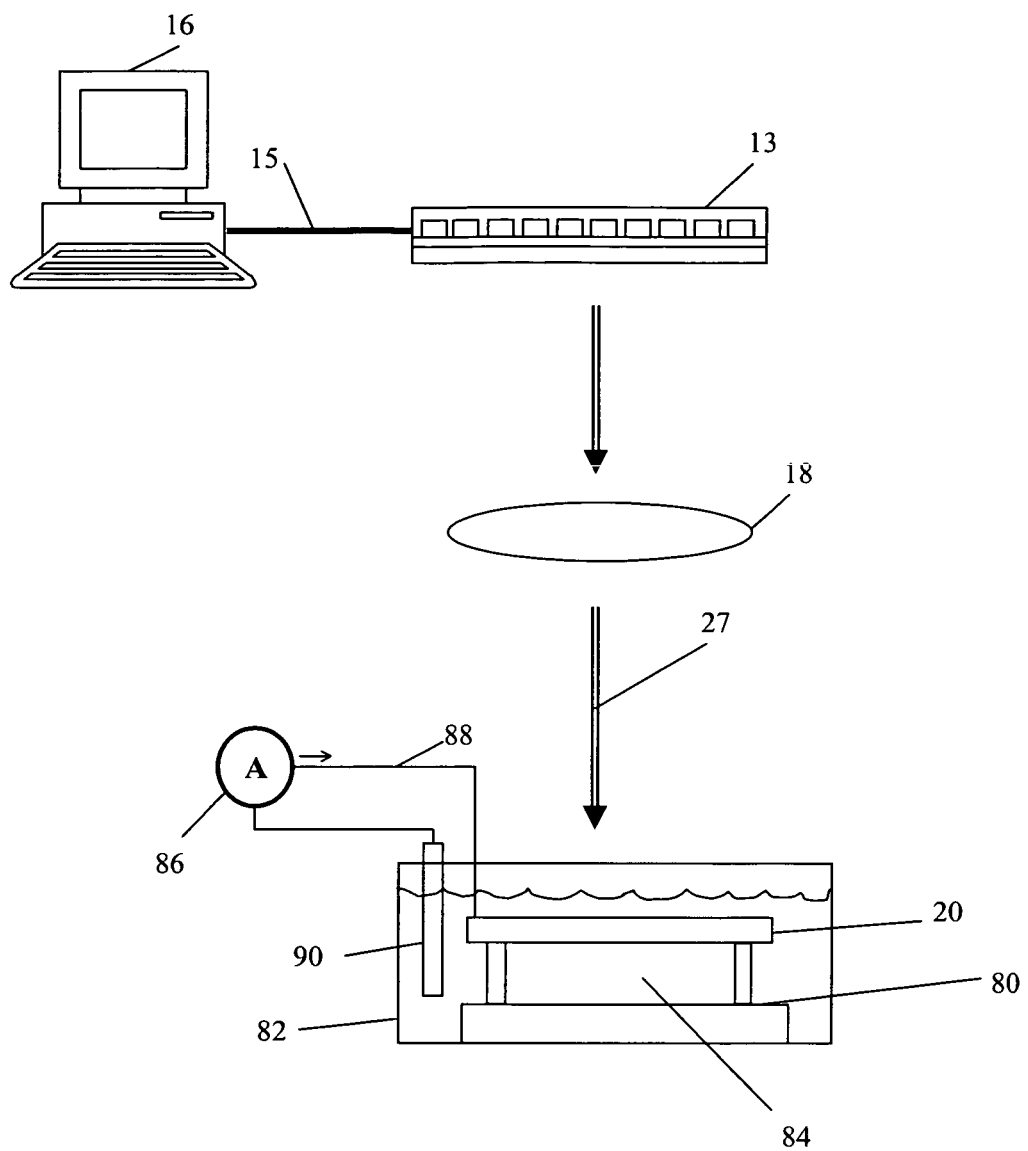
FIG. 3B illustrates a maskless photolithography system for photo stimulated etching of objects in a liquid solution according to an embodiment of the present invention using a plasma display.

Referring now to FIG. 3A, an embodiment of the current invention for photo stimulated etching of objects in a liquid solution is depicted. In the embodiment, a maskless photolithography system is combined with an electrochemical cell to etch objects by exposing the objects to radiation while submerged in an electrochemical bath. Patterns generated on the submerged objects are defined by the patterned light radiated by the maskless photolithography system.

As shown in FIG. 3A, a maskless lithography system for etching of objects in a liquid solution includes a light source 10, a removable filter 11, a first lens system 12, a micromirror array 14, a computer system 16, a second lens system 18, and a substrate 20, affixed to a mount 80, submerged in an electrochemical cell 82 of photoreactive etchant solution 84. In an embodiment, a current meter 86 is provided to monitor the process by attaching a positive lead 88 to the semiconductor-type substrate 20, and submerging a negative lead 90, such as a platinum electrode, in the etchant solution 84, wherein the substrate 20 acts as an anode and the negative lead acts as a cathode. In alternative embodiments, a movable alignment fixture 22 upon which the electrochemical cell 82 is mounted, and an optical viewer 24 are provided as depicted in FIG. 1.

As shown in FIG. 3A, light source 10 provides a beam of collimated light, or light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light according to a desired mask pattern stored in memory. In addition, computer system 16 can shift the desired mask pattern in two dimensions to align the pattern with the substrate 20.

As previously described in the alternative embodiment shown in FIG. 1B, a plasma display device 13 can be substituted for the micromirror array, light source and associated optics. Thus, the light source and patterning system can be combined in an integrated plasma display device 13.

After being reflected in a desired pattern from micromirror array 14, patterned light beam 27 passes through second lens system 18, and impinges the substrate 20, thereby creating a pattern on the substrate 20 submerged in the etchant solution 24. By illuminating the semiconductor-type substrate 20, the patterned light beam 27 generates electron hole pairs in the substrate 20 which enhances the reduction and oxidation reactions within the electrochemical cell 22. As a result, the semiconductor-type substrate 20 is anisotropically etched in the regions where the patterned light beam 27 illuminates the surface of the substrate 20, whereby the radiated pattern is recreated on the substrate. Using this technique, semiconductor devices can be created in a variety of semiconductor materials, such as p-type silicon, n-type silicon, and n-type Gallium Nitride (GaN) materials.

III. Maskless Photolithography Patterning of Photosensitive and Photochromic Glass.

Figure 4A:
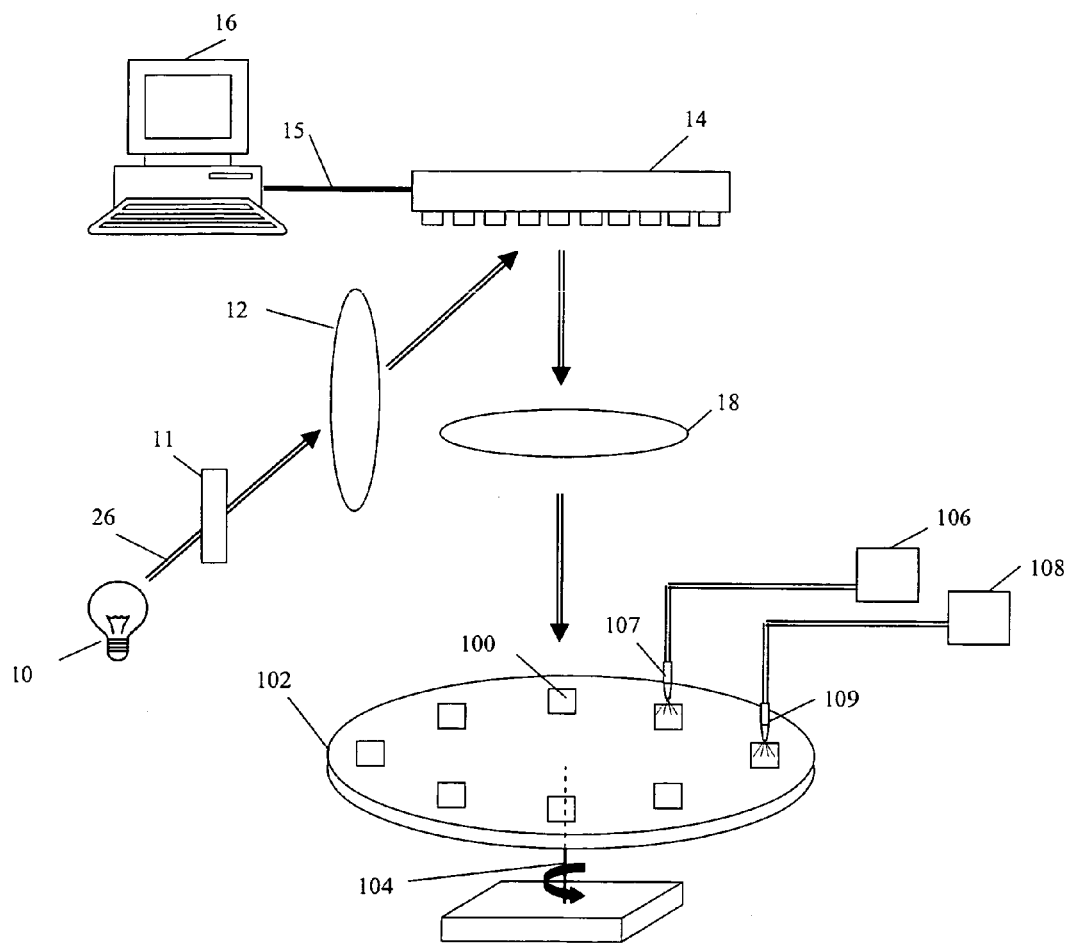
FIG. 4A illustrates a maskless photolithography system for patterning photosensitive and photochromic glass according to an embodiment of the present invention.

Referring now to FIG. 4A, an embodiment of the current invention for patterning of photosensitive and photochromic glass is depicted. In the embodiment, a maskless photolithography system is combined with irradiation of photoreactive glass to create patterning of designs, colors, and structures in photoreactive glass. The projection of light upon photoreactive glass causes changes in the glass transmission characteristics. Permanent shading and etched structures are created in photosensitive glass that reacts with light by changing composition. By exposing photosensitive glass to light radiation, a change in the composition of the glass is induced and renders the exposed areas of the glass susceptible to anisotropic etching by acid in the exposed regions. Ornamental designs, lens arrays, art glass, glass channels, architectural glass, and high aspect microstructures may be created in this manner. In an alternative embodiment, temporary image projection and displays are created in photochromic glass that changes transmissive properties in the presence of light.

As shown in FIG. 4A, a maskless lithography system for patterning of photosensitive and photochromic glass includes a light source 10, a removable filter 11, a first lens system 12, a micromirror array 14, a computer system 16, a second lens system 18, and a glass substrate 100. In alternative embodiments, an optical viewer 24, as depicted in FIG. 1, and a circular alignment fixture 102, rotatably mounted on an axis 104 for mounting target glass substrates 100 is provided. In a further embodiment, a water reservoir 106 and an acid reservoir 108, fluidically connected to and providing rinse water and acid etchant through nozzles 107 and 109, respectively, are positioned to sequentially apply etching acid and water rinse to target glass substrates 100 passing under the patterned light beam 27.

As shown in FIG. 4A, light source 10 provides a light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light according to a desired mask pattern stored in memory. In addition, computer system 16 can shift the desired mask pattern in two dimensions to align the pattern with the glass substrate 100. After being reflected in a desired pattern from micromirror array 14, patterned light beam 27 passes through second lens system 18, and impinges the substrates 100 sequentially as the glass substrates 100 are rotated beneath the patterned light beam 27. Following irradiation, each glass substrates 100 is subjected to a water rinse and acid rinse, each of these treatments applied through nozzles 106 and 107, respectively, positioned above the path of each glass substrates 100.

Figure 4B:
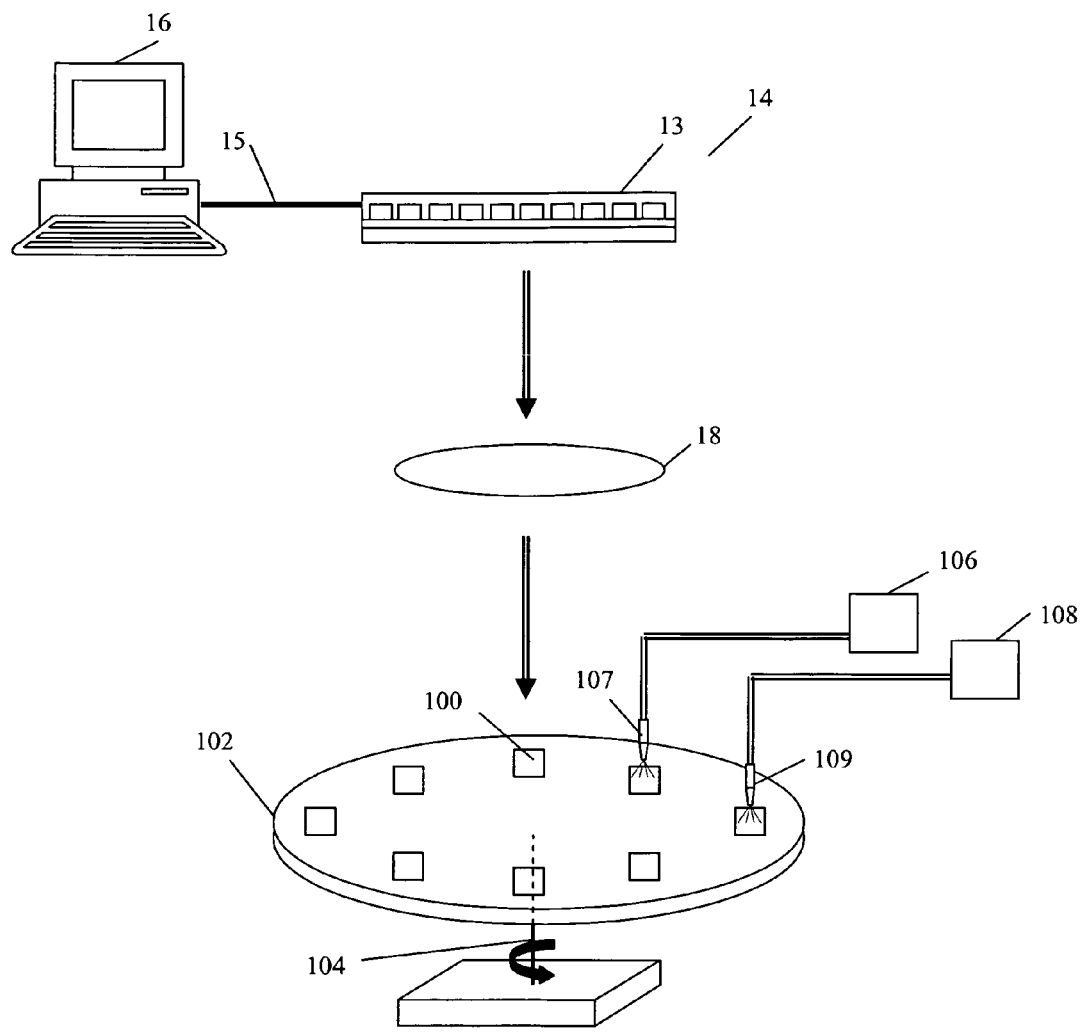
FIG. 4B illustrates a maskless photolithography system for patterning photosensitive and photochromic glass according to an embodiment of the present invention using a plasma display.

As previously described, a plasma display device 13 can be substituted for the micromirror array 14, light source 10 and associated optics as shown in FIG. 4B. Thus, the light source and patterning system can be combined in an integrated plasma display device 13.

IV. Maskless Photolithography for Photoselective Metal Deposition.

Figure 5A:
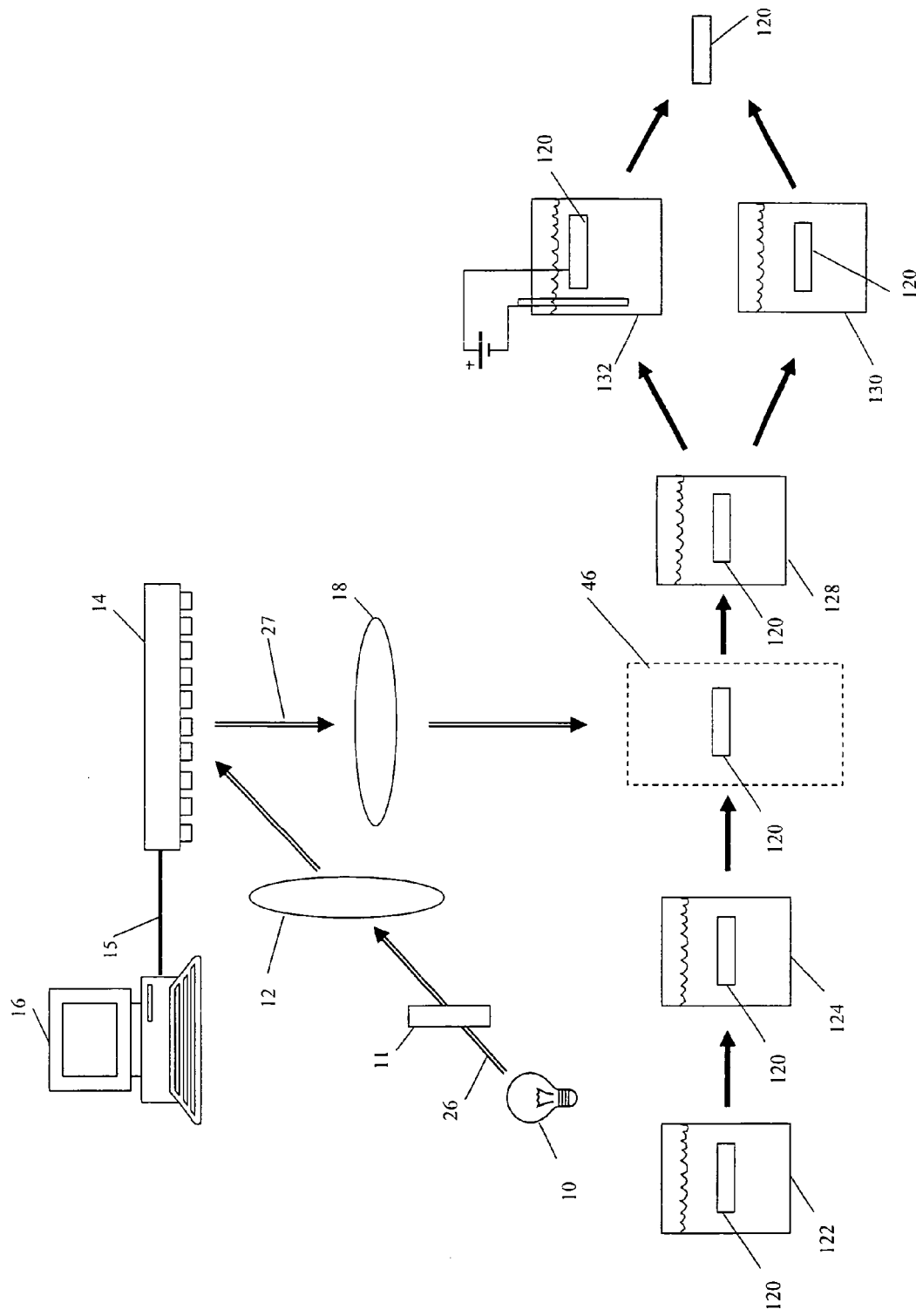
FIG. 5A illustrates a maskless photolithography system for photoselective metal deposition according to an embodiment of the present invention.

Referring now to FIG. 5A, an embodiment of the current invention for photoselective metal deposition is depicted. In the embodiment, a maskless photolithography system is combined with a chemical bath to deposit metal in patterns on objects by exposing the objects to radiation while submerged in or after removal from the chemical bath. Patterns generated on the submerged objects are defined by the patterned light radiated by the maskless photolithography system. While the traditional method for making printed metal patterns uses a subtractive technique, including etching away unwanted material, in the present embodiment, material is added according to a desired pattern. Selective metal deposition from solution is activated by light irradiation onto a submerged or non-submerged substrate. The chemical solution is light sensitive and light activated so that where light impinges on a submerged or non-submerged substrate in a pre-selected pattern, activation for plating of the metal is provided.

As shown in FIG. 5A, a maskless lithography system for photoselective metal deposition includes a light source 10, a removable filter 11, a first lens system 12, a micromirror array 14, a computer system 16, a second lens system 18, and a metal substrate 120. In alternative embodiments, a movable alignment fixture 22, and an optical viewer 24 are provided as depicted in FIG. 1A.

As depicted in FIG. 5A, light source 10 provides a light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light according to a desired mask pattern stored in memory. In addition, computer system 16 can shift the desired mask pattern in two dimensions to align the pattern with the metal substrate 120. After being reflected in a desired pattern from micromirror array 14, patterned light beam 27 passes through second lens system 18, and impinges the metal substrate 120.

In the present embodiment, the substrate 120 is first coated with a light responsive catalytic/electrochemically reactive layer, such tin oxide, in a coating tank 122. Following a rinse in a rinse tank 124, the metal substrate 120 is positioned in the exposure station 126, where the substrate 120 is exposed to the patterned light beam 27, radiating, for example, light in the UV range. The exposed regions are then made receptive to the introduction of additional surface coatings, such as palladium chloride solution, in a second coating tank 128. Next, the coated substrate 120 having a pattern created in the exposure station 126, is subjected to third chemical bath to accept additional metals, such as copper. In an embodiment, the third chemical bath is an electro-less bath 130, or alternatively, an electrolytic plating bath 132. The resulting substrate 120, has a metal pattern defined by the projected patterned light beam 27.

Figure 5B:
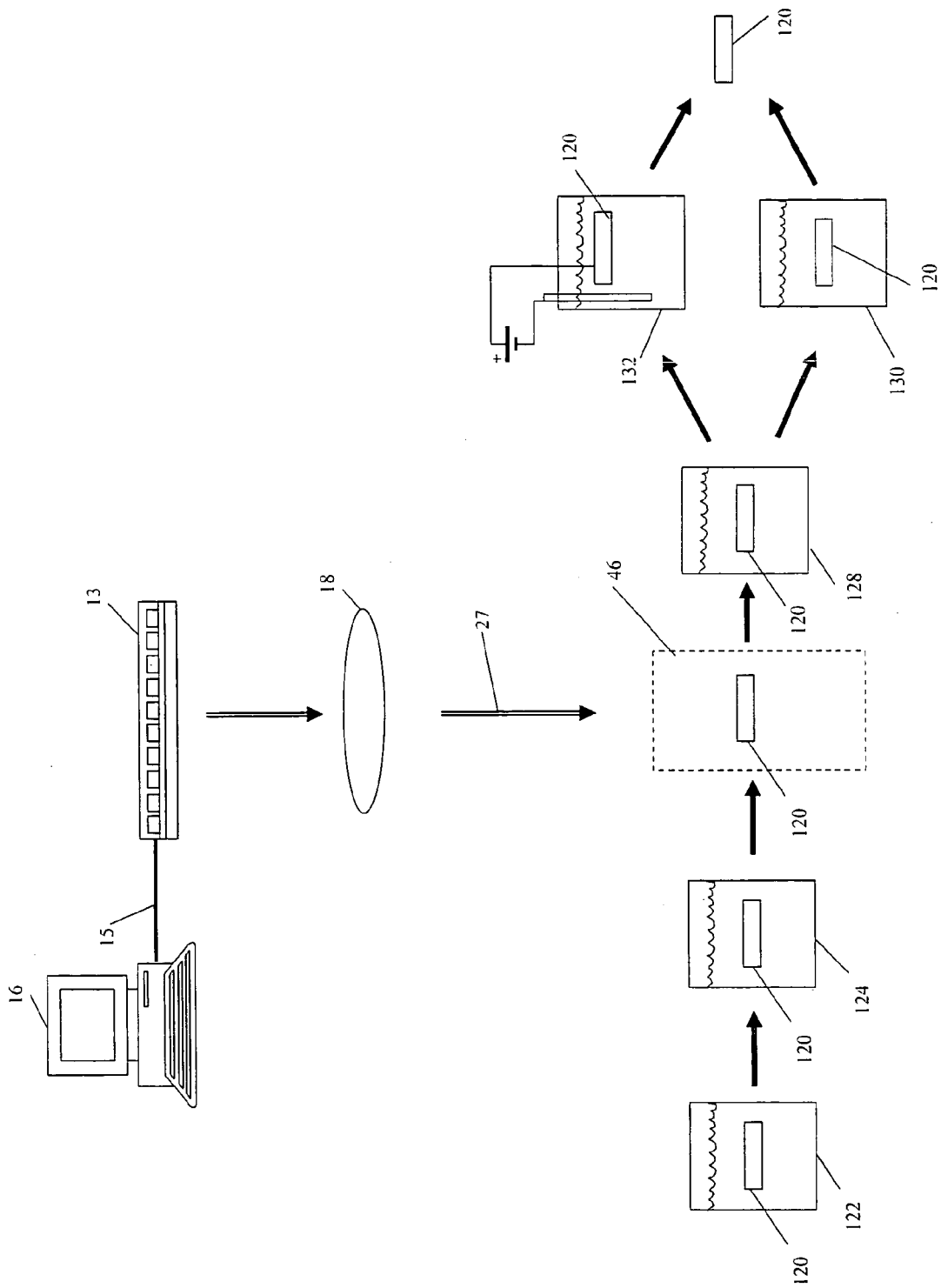
FIG. 5B illustrates a maskless photolithography system for photoselective metal deposition according to an embodiment of the present invention using a plasma display.

As previously described, a plasma display device 13 can be substituted for the micromirror array 14, light source 10 and associated optics as shown in FIG. 5B. Thus, the light source and patterning system can be combined in an integrated plasma display device 13.

It should be appreciated that one skilled in the art that the process may be configured in any number of modes as known in the art, such as bath mode or continuous belt mode. Further the substrate may comprise a rigid or flexible material, subjected to a variety of metals depending on the plating solution (s)

Furthermore, many other variations are possible using the present inventive system and method. For example, the invention can be used for rapidly creating micro electro-mechanical (MEMs) devices, creating artificial receptors chips, creating integrated circuit patterns of conducting polymers, creating integrated microsensor arrays and fluid delivery networks, chemical vapor deposition, thin film fabrication, gray scale photolithography, and large area pattern expression.

Based on the foregoing specification, the computer system of the disclosed invention may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the invention. The computer readable media may be, for instance, a fixed (hard) drive, diskette, optical disk, magnetic tape, semiconductor memory such as read-only memory (ROM), etc., or any transmitting/receiving medium such as the Internet or other communication network or link. The article of manufacture containing the computer code may be made and/or used by executing the code directly from one medium, by copying the code from one medium to another medium, or by transmitting the code over a network.

One skilled in the art of computer science will easily be able to combine the software created as described with appropriate general purpose or special purpose computer hardware to create a computer system or computer sub-system embodying the method of the invention. An apparatus for making, using or selling the invention may be one or more processing systems including, but not limited to, a central processing unit (CPU ), memory, storage devices, communication links and devices, servers, I/O devices, or any sub-components of one or more processing systems, including software, firmware, hardware or any combination or subset thereof, which embody the invention. User input may be received from the keyboard, mouse, pen, voice, touch screen, or any other means by which a human can input data into a computer, including through other programs such as application programs.

It should be understood that the examples and embodiments described herein are for illustrative purposes only and that various modifications or changes in light thereof will be suggested to persons skilled in the art and are to be included within the spirit and purview of the claims.

What is claimed is:

1. A method for maskless photolithography for photoselective metal deposition on a substrate, comprising:
   coating a substrate with a light responsive catalytic reactive layer;
   exposing the coated substrate to a patterned light beam; and
   subjecting the coated substrate to a chemical bath, wherein a metal in the chemical bath is deposited on the exposed regions of the coated substrate, wherein exposing the coated substrate to the patterned light beam results in regions of the coated substrate being exposed to light and other regions of the coated substrate not being exposed to light in accordance with the patterned light beam, wherein the metal in the chemical bath is not deposited on the non-exposed regions of the coated substrate.

2. The method according to claim 1, wherein the light responsive catalytic layer comprises tin oxide.

3. The method according to claim 1, further comprising rinsing the coated substrate in a rinse tank before exposing the coated substrate.

4. The method according to claim 1, wherein exposing the coated substrate comprises exposing the coated substrate while the coated substrate is submerged.

5. The method according to claim 1, wherein the patterned light beam comprises light in the UV range.

6. The method according to claim 1, wherein after exposing the coated substrate to a patterned light beam, further comprising:
   subjecting the coated substrate to a surface coating bath of additional surface coatings, wherein the exposed regions are receptive to the introduction of the additional surface coatings.

7. The method according to claim 6, wherein subjecting the coated substrate to a surface coating bath of additional surface coatings comprises subjecting the coated substrate to a palladium chloride solution.

8. The method according to claim 1, wherein the metal in the chemical bath is copper.

9. The method according to claim 1, wherein the chemical bath is an electro-less bath.

10. The method according to claim 1, wherein the chemical bath is an electrolytic plating solution bath.

11. The method according to claim 1, wherein exposing the coated substrate to the patterned light beam is prior to subjecting the coated substrate to the chemical bath.

12. The method according to claim 1, wherein the metal is deposited in a pattern defined by the patterned light beam.

13. The method according to claim 1, wherein the exposed regions are made receptive to deposition of the metal.

14. The method according to claim 1, wherein the metal deposited on the exposed regions of the coated substrate creates a metal pattern defined by the patterned light beam.

* * * * *

UNITED STATES PATENT AND TRADEMARK OFFICE
CERTIFICATE OF CORRECTION

PATENT NO. : 7,572,573 B2
APPLICATION NO. : 11/343594
DATED : August 11, 2009
INVENTOR(S) : David P. Fries It is certified that error appears in the above-identified patent and that said Letters Patent is hereby corrected as shown below:

Column 1,
Line 36, "all ofwhich" should read --all of which--.

Column 3,
Line 65, "amaskless" should read --a maskless--.

Column 5,
Lines 65-66, "with a mask pattern information" should read --with mask pattern information--.

Column 6,
Line 35, "optical viewer 24, provides" should read --optical viewer 24 provides--.

Column 11,
Line 38, "station 126," should read --station 126--.
Line 41, "substrate 120, has" should read --substrate 120 has--.

Column 12,
Line 20, "(CPU )," should read --(CPU),--.

Signed and Sealed this

Tenth Day of November, 2009

David J. Kappos
*Director of the United States Patent and Trademark Office*